United States Patent
Bae et al.

(10) Patent No.: US 7,352,021 B2
(45) Date of Patent: Apr. 1, 2008

(54) MAGNETIC RANDOM ACCESS MEMORY DEVICES HAVING TITANIUM-RICH LOWER ELECTRODES WITH OXIDE LAYER AND ORIENTED TUNNELING BARRIER

(75) Inventors: Jun-Soo Bae, Gyeonggi-do (KR); Jang-Eun Lee, Gyeonggi-do (KR); Hyun-Jo Kim, Gyeonggi-do (KR); In-Gyu Baek, Seoul (KR); Young-Ki Ha, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/888,964

(22) Filed: Jul. 9, 2004

(65) Prior Publication Data
US 2005/0006682 A1 Jan. 13, 2005

(30) Foreign Application Priority Data
Jul. 10, 2006 (KR) .................... 10-2003-0046796

(51) Int. Cl.
*H01L 29/76* (2006.01)
(52) U.S. Cl. .................... 257/295; 438/3; 438/238; 257/E43.004; 257/E43.006
(58) Field of Classification Search ............... 257/295; 438/3, 238
See application file for complete search history.

(56) References Cited

U.S. PATENT DOCUMENTS 4,783,248 A * 11/1988 Kohlhase et al. ...... 204/192.17
5,699,293 A 12/1997 Tehrani et al.
5,986,925 A 11/1999 Naji et al.
6,538,861 B1 3/2003 Hayashi et al.
6,639,765 B2 10/2003 Adachi et al.
6,710,987 B2 3/2004 Sun et al.
6,903,908 B2 * 6/2005 Hayashi et al. .......... 360/324.2
2001/0040781 A1 * 11/2001 Tanaka et al. ......... 360/324.12
2002/0036315 A1 3/2002 Adachi et al.
2002/0132469 A1 * 9/2002 Lee et al. .................... 438/628
2003/0199104 A1 * 10/2003 Leuschner et al. ............. 438/3
2004/0145850 A1 * 7/2004 Fukumoto et al. .......... 361/143
2005/0051820 A1 * 3/2005 Stojakovic et al. ......... 257/295

FOREIGN PATENT DOCUMENTS

| JP | 5-295516 | * | 11/1993 |
| JP | 11-3890 | * | 1/1999 |
| JP | 2002-111094 A | | 4/2002 |
| JP | 2002-158381 | * | 5/2002 |
| KR | 10-0378411 B1 | | 3/2003 |

* cited by examiner

Primary Examiner—A. Sefer
(74) Attorney, Agent, or Firm—Myers Bigel Sibley & Sajovec, P.A.

(57) ABSTRACT

Magnetic Random Access Memory (MRAM) devices include a lower electrode and a magnetic tunnel junction on the lower electrode. The magnetic tunnel junction includes a seed layer and a tunneling barrier that is oriented in a same direction as the most closely packed plane direction of the seed layer. An oxide layer may be provided between the lower electrode and the magnetic tunnel junction. The lower electrode may be a titanium-rich TiN layer having more than 50 atomic percent titanium content. Analogous fabrication methods are also described.

14 Claims, 4 Drawing Sheets

| | Providing Oxygen(O₂) after IBE | RA (0.1V) | MR (0.1V) | RA (0.4V) | MR (0.4V) |
|---|---|---|---|---|---|
| (Ti-rich)TiN Having a Relatively Large Content of Titanium | No | 3.0 | 36.6 | 2.8 | 28.7 |
| | YES | 6.3 | 41.9 | 6.0 | 33.5 |
| Stoichiometric TiN | No | 8.9 | 36.8 | 8.9 | 28.4 |
| | YES | 10.7 | 38 | 10.5 | 29.5 |

MAGNETIC RANDOM ACCESS MEMORY DEVICES HAVING TITANIUM-RICH LOWER ELECTRODES WITH OXIDE LAYER AND ORIENTED TUNNELING BARRIER

RELATED APPLICATION

This application claims the benefit of Korean Patent Application No. 2003-0046796, filed Jul. 10, 2003, the disclosure of which is hereby incorporated herein by reference in its entirety as if set forth fully herein.

FIELD OF THE INVENTION

This invention relates to integrated circuit memory devices and fabricating methods thereof, and more particularly to Magnetic Random Access Memory Cells (MRAM) and fabricating methods thereof.

BACKGROUND OF THE INVENTION

MRAMs have been widely investigated and used as nonvolatile memory devices that can be operated at low voltage and at high speed. In an MRAM cell, data is stored in a magnetic resistor that includes a Magnetic Tunnel Junction (MTJ) having first and second ferromagnetic layers and a tunneling barrier layer therebetween. In some devices, the magnetic polarization of the first ferromagnetic layer, also referred to as a free layer, is changed utilizing a magnetic field that crosses the MTJ. The magnetic field may be induced by an electric current passing around the MTJ, and the magnetic polarization of the free layer can be parallel or anti-parallel to the magnetic polarization of the second ferromagnetic layer, also referred to as a fixed layer. According to spintronics based on quantum mechanics, a tunneling current passing through the MTJ in the parallel direction may be greater than that in the anti-parallel direction. Thus, the magnetic polarizations of the free layer and the fixed layer can define the electrical resistance of the magnetic resistor, to provide an indication of the stored information in the MRAM.

The MJT is generally formed on a lower electrode of stoichiometric TiN consisting of a 1:1 mixture of titanium and nitrogen. Chemical Mechanical Polishing (CMP) is then performed on the stoichiometric TiN to obtain a desired thickness thereof. It is well known that CMP speed of stoichiometric TiN may be high, such as a rate of about 40 Å/sec. Accordingly, there may be difficulty in controlling a desired thickness of residual TiN after CMP. In other words, the lower electrode of TiN may not be formed at a desired thickness. For example, even if the lower electrode is desired to be 400 Å to 500 Å, an initial deposition thickness of TiN should be about 1,000 Å at a minimum in consideration of the thickness removed during CMP. Therefore, process costs may increase.

Furthermore, since stoichiometric TiN has a relatively high CMP speed, the surface roughness of stoichiometric TiN may be excessive after CMP. Surface roughness of an aluminum layer formed on the TiN also may be excessive. Aluminum performs a function to form tunneling barrier of the MTJ that will be deposited in a subsequent process. Accordingly, inadequate magnetic resistance ratio (MR) and/or resistance (RA) of the MJT may occur.

In another approach, crystalline stoichiometric TiN is used as a lower electrode. However, if the MTJ is deposited on an upper surface of stoichiometric TiN, several layers or films of the MTJ may depend on the crystallinity of the crystalline stoichiometric TiN lower electrode.

Specifically, when an aluminum oxide layer ($AlO_x$) as a tunneling barrier is orientated in a (111) plane, the tunneling effect of current may be increased. Because aluminum is a face centered cube (FCC), the most closely packed plane density of aluminum exhibits a (111) plane. Accordingly, with improving (111) orientation, aluminum is formed to be closely packed structure. Also, an aluminum oxide layer ($AlO_x$) that will be oxidized in a subsequent process may be formed with high density to increase magnetic resistance ratio (MR).

However, since the orientation of aluminum may depend on the orientation of the stoichiometric TiN used as the lower electrode, it may be difficult for aluminum to be formed with the most closely packed structure. As a result, it may be difficult to accomplish high magnetic resistance ratio (MR) and/or tunneling effect with high current.

SUMMARY OF THE INVENTION

Some embodiments of the present invention provide magnetic tunnel junction structures for Magnetic Random Access Memory (MRAM) devices that include a lower electrode and a magnetic tunnel junction on the lower electrode. The magnetic tunnel junction includes a seed layer and a tunneling barrier that is oriented in a same direction as the most closely packed plane direction of the seed layer. In other embodiments, an oxide layer is provided between the lower electrode and the magnetic tunnel junction. In still other embodiments, the lower electrode comprises a titanium-rich (Ti-rich) TiN layer. As used herein, a "titanium-rich TiN layer" has more than 50 atomic percent titanium content. Combinations and subcombinations of the most closely packed plane orientation of the tunneling barrier, the oxide layer and/or the Ti-rich TiN layer also may be provided. Analogous fabrication methods also may be provided.

In some embodiments of the present invention, an oxide layer is formed between a lower electrode and the MTJ. The oxide layer can perform a function as a crystal prevention layer that can reduce or prevent crystallinity of the lower electrode from propagating with respect to a tunneling barrier of the MTJ. In addition, in some embodiments, the lower electrode is formed of a Ti-rich TiN layer having a relatively large content of titanium.

Methods of forming an MTJ structure of an MRAM according to some embodiments of the present invention comprise: forming a lower electrode; forming an oxide layer on the lower electrode; and forming a magnetic tunnel junction comprised of, in some embodiments, a sequentially stacked structure of a fixed layer, a tunneling barrier and a free layer. The fixed layer includes at least a seed layer, an anti-ferromagnetic layer and a first ferromagnetic layer on the oxide layer. The tunneling barrier is orientated in a same crystalline direction as a most closely packed plane direction of the seed layer. The free layer includes at least a second ferromagnetic layer.

In some embodiments, the lower electrode is formed by: forming a Ti-rich TiN layer; chemical/mechanical polishing the Ti-rich TiN layer; and ion beam etching the Ti-rich TiN layer. In some embodiments, the titanium content of the Ti-rich TiN layer is between about 70 and about 90 atomic percent. In some embodiments, the lower electrode and oxide layers are formed in-situ. In some embodiments, the seed layer and the tunneling barrier are formed with the same crystalline structure. In some embodiments, the crystalline structure is the face centered cubic structure (FCC).

In some embodiments, the seed layer is formed of tantalum (Ta), and the tunneling barrier is formed by oxidizing aluminum (Al). Moreover, in some embodiments, the first ferromagnetic layer is comprised of a stacked structure of two ferromagnetic materials. A non-ferromagnetic layer is further formed comprising at least one of Ru, Re, Rh, Cu and/or Cr between two ferromagnetic materials. The second ferromagnetic layer is comprised of a stacked structure of two ferromagnetic materials. A cap layer is further formed on the second ferromagnetic layer.

In some embodiments, an MTJ is formed by: sequentially forming the seed layer, the anti-ferromagnetic layer and the first ferromagnetic layer; forming a material layer on the first ferromagnetic layer, the crystalline structure of the material layer being identical to that of the seed layer; oxidizing the material layer; forming the second ferromagnetic layer on the oxidized material layer; and patterning the second ferromagnetic layer, the oxidized material layer, the first ferromagnetic layer, the anti-ferromagnetic layer and the seed layer to form the fixed layer, the tunneling barrier and the free layer. The fixed layer is comprised of the seed layer, the anti-ferromagnetic layer and the first ferromagnetic layer. The tunneling barrier is formed of the oxidized material layer. The free layer is formed of the second ferromagnetic layer. The cap layer is further formed of tantalum (Ta) on the second ferromagnetic layer.

Methods of forming an MTJ of an MRAM according to further embodiments of the present invention comprise: depositing a Ti-rich TiN layer; chemical mechanical polishing the Ti-rich TiN layer; ion beam etching the Ti-rich TiN layer to form a lower electrode; and providing oxygen in-situ to form an oxide layer. A seed layer, an anti-ferromagnetic layer and a first ferromagnetic layer are sequentially formed on the oxide layer. A material layer is formed on the first ferromagnetic layer and is oxidized. The crystalline structure of the material layer is identical to that of the seed layer. A second ferromagnetic layer is formed on the oxidized material layer. A cap layer is formed on the second ferromagnetic layer. The cap layer, the second ferromagnetic layer, the oxidized material layer, the first ferromagnetic layer, the anti-ferromagnetic layer and the seed layer are patterned to form the fixed layer, the tunneling barrier and the free layer. The fixed layer is comprised of the seed layer, the anti-ferromagnetic layer and the first ferromagnetic layer. The tunneling barrier is formed of the oxidized material layer. The free layer is comprised of the cap layer and the second ferromagnetic layer.

In some embodiments, the titanium content of the Ti-rich TiN is between about 70 and about 90 atomic percent, the crystalline structure is the face centered cubic (FCC) structure, the seed layer is formed of tantalum (Ta), and the material layer is formed of aluminum (Al).

In some embodiments, the first ferromagnetic layer is comprised of a stacked structure of two ferromagnetic materials. A non-ferromagnetic layer is further formed of at least one of Ru, Re, Rh, Cu and/or Cr between two ferromagnetic materials. The second ferromagnetic layer is comprised of a stacked structure of two ferromagnetic materials. The cap layer is formed of tantalum (Ta).

An MTJ of an MRAM according to embodiments of the present invention comprises a lower electrode; an oxide layer on the lower electrode; a fixed layer including at least a seed layer, an anti-ferromagnetic layer and a first ferromagnetic layer; a tunnel barrier orientated in the same crystalline direction as the most closely packed plane direction of the seed layer to be crystallized; and a free layer including at least a second ferromagnetic layer. In some embodiments, the lower electrode is formed of TiN having a relatively large content of titanium (Ti), and the titanium content of the TiN is between about 70 and about 90 atomic percent in some embodiments. In some embodiments, the crystalline stricture of the seed layer is identical to that of the tunneling barrier, and the crystalline structure is the face centered cubic (FCC) layer. In some embodiments, the seed layer is formed of tantalum (Ta), and the tunneling barrier is formed of $AlO_X$.

In some embodiments, the first ferromagnetic layer comprises two ferromagnetic materials stacked and a non-ferromagnetic layer between the two ferromagnetic materials. The non-ferromagnetic layer is formed of at least one of Ru, Re, Rh, Cu and/or Cr. The second ferromagnetic layer is comprised of a stacked structure of two ferromagnetic materials. The cap layer is further formed on the second ferromagnetic layer.

According to some embodiments of the present invention, since the lower electrode is formed of Ti-rich TiN having a relatively low chemical mechanical polishing rate, it is possible to adequately control the thickness of the residual TiN after CMP. The roughness of the tunneling barrier of the MTJ also can be improved by improving surface roughness of the lower electrode. In addition, in some embodiments, the crystalline structure of the tunneling barrier of the MTJ can be independent of that of the lower electrode by interposing the oxide layer between the lower electrode and the MTJ. Furthermore, in some embodiments, the orientation of the tunneling barrier may be improved due to crystallinity of the seed layer, so that the magnetic resistance ratio (MR) is increased.

DETAILED DESCRIPTION

Figure 1:
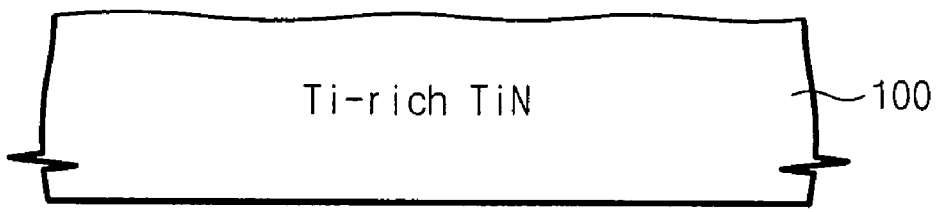
FIG. 1 to FIG. 6 are cross-sectional views of magnetic tunnel junction (MTJ) structures of magnetic random access memory (MRAM) devices according to embodiments of the present invention during intermediate fabrication steps according to some embodiments of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. The term "directly on"

means that there are no intervening elements. Furthermore, relative terms such as "below" or "above" may be used herein to describe a relationship of one layer or region to another layer or region relative to a substrate or base layer as illustrated in the figures. It will be understood that these terms are intended to encompass different orientations of the device in addition to the orientation depicted in the figures. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a layer illustrated as having a smooth surface will, typically, have some roughness rather than the exact shapes shown in the figures. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

Referring to FIG. 1, a Ti—N layer, and in some embodiments a Ti-rich Ti—N layer 100, having larger content of titanium (Ti) than stoichiometric TiN, is formed in a certain thickness on an insulation layer (not shown) that is formed on a substrate (not shown) including transistors, etc. In some embodiments, the amount of Ti in the Ti-rich TiN 100 layer is between approximately 70 and approximately 90 atomic percent in comparison with stoichiometric TiN. The Ti-rich TiN layer 100 having Ti contents with about 70 to about 90 atomic percent is polished, for example, at about 5 Å/sec CMP rate. Accordingly, the thickness of residual TiN may be well controlled in a subsequent CMP process. As a result, the Ti-rich TiN layer 100 may have a desired thickness during an etching process to form a subsequent magnetic tunnel junction (MJT).

For example, assuming that the Ti-rich TiN 100 as a lower electrode is formed at about 400 Å thickness, Ti-rich TiN may be deposited at about 500 Å thickness early in the process. This is because about 100 Å of the Ti-rich TiN layer 100 may be removed during etching to form the MTJ and an additional portion of the Ti-rich TiN may be removed during CMP. Accordingly, if a desired thickness of a lower electrode is about 400 Å on condition that chemical mechanical speed is at a rate of about 5 Å/sec in a subsequent CMP, Ti-rich TiN layer 100 may be deposited with about 500 Å thickness in its early stage. As a result, a thinner Ti-rich TiN layer 100 may be deposited in its early stage, and the amount of residual Ti-rich TiN layer 100 may be well defined.

As previously mentioned, the Ti-rich TiN layer 100 is formed on the insulation layer and electrically connected through electrical conductive component(s) such as a plug to an impurity junction region of transistor. However, the substrate, the transistor and the insulation layer, etc. may be conventional (present day or later developed), and hence explanation of them in detail shall be omitted.

Figure 2:
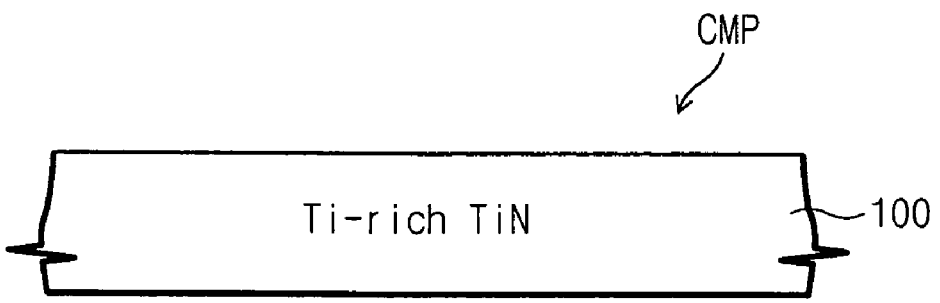

Referring to FIG. 2, the Ti-rich Ti—N layer 100 is polished by CMP to improve planarizing and decrease roughness. The Ti-rich TiN layer 100 has a relatively large content of titanium as compared with nitrogen (N), so that the CMP rate is low (e.g., about 5 Å/sec). Accordingly, the amount of residual Ti-rich TiN layer 100 after CMP may be well defined.

In addition, the Ti-rich TiN layer 100 after CMP can have low surface roughness (e.g., a root-mean-square (RMS) roughness of about 1 Å). If surface roughness of the Ti-rich TiN layer 100 is low, the surface roughness of a film or layer, which will be deposited on the Ti-rich TiN layer 100 in a subsequent process, also can be low.

Figure 3:
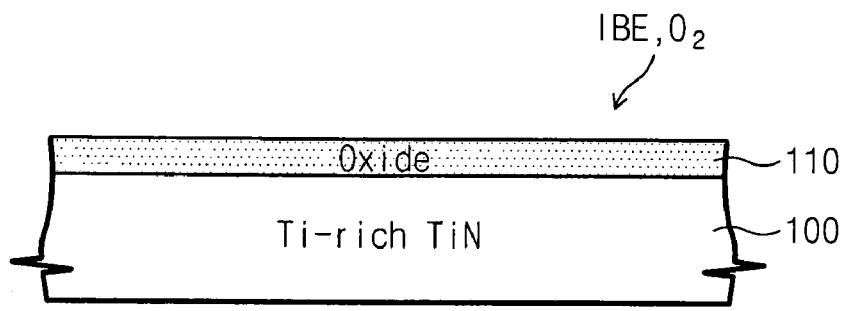

Referring to FIG. 3, by performing ion beam etching (IBE), and/or a conventional etching, the polished Ti-rich TiN layer 100 is patterned to form the lower electrode having a desired shape. When the lower electrode 100 is formed by performing IBE, an oxide layer 110 may be formed on the lower electrode 100 by performing IBE and providing $O_2$ gas in-situ in one apparatus. In other words, the lower electrode 100 and the oxide layer 110 are formed by providing $O_2$ gas in-situ and performing IBE using, for example, a physical vapor deposition (PVD) process such as sputtering.

As described later, a magnetic tunnel junction (MTJ), which is comprised of a stacked structure of several films or layers, is formed on the lower electrode 100. The combination of the lower electrode and the MTJ may be referred to herein as a magnetic tunnel junction structure. In some embodiments, the Ti-rich TiN layer used as the lower electrode 100 is crystalline. Accordingly, if the MTJ is formed on the Ti-rich TiN layer or the lower electrode 100 by a deposition process, the crystal structure of several films or layers composed of the MTJ may be influenced by the crystallinity of lower electrode 100. To reduce or avoid this phenomenon, an oxide layer, which can act as a crystal prevention layer, is formed on the lower electrode 100 to form part of an MTJ structure in some embodiments of the invention.

Figure 4:
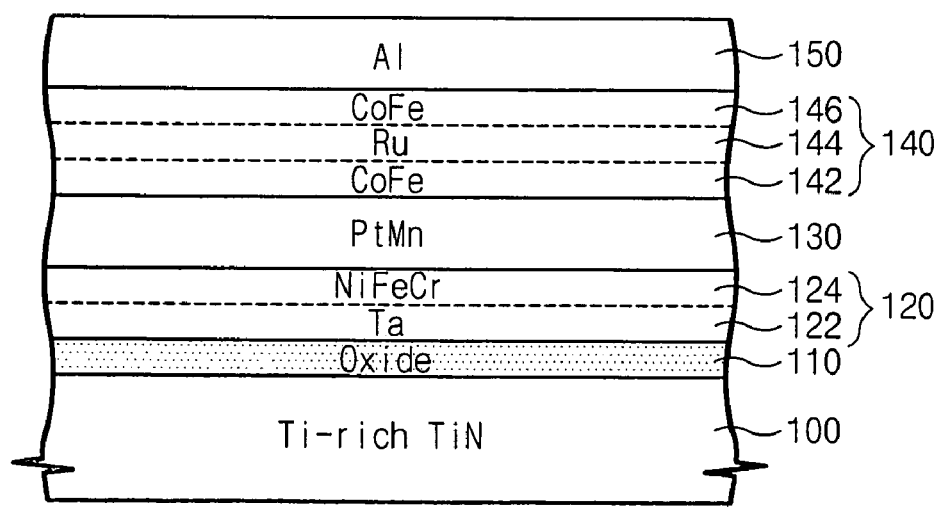

Referring to FIG. 4, to form the MTJ including a fixed layer, a tunneling barrier and a free layer, first of all, a seed layer 120 is formed. The seed layer 120 is formed to change the crystallographic texture of films or layers that will be deposited in a subsequent process into a desired crystallographic texture. Specifically, when the tunneling barrier that will be deposited in a subsequent process has a desired crystal structure, a magnetic resistance ratio (MR) may be increased.

In some embodiments, the seed layer 120 may be comprised of two stacked structures, for example, a sequentially stacked structure of tantalum 122 and NiFeCr 124 alloyed with Ni—Fe—Cr. In particular, if an aluminum oxide layer ($AlO_x$) is used as the tunneling barrier, the bottom of the seed layer 122 may be formed of tantalum (Ta) having the same crystalline structure as aluminum (Al), that is, a face centered cubic (FCC) structure. In some embodiments, the bottom of the seed layer 122 formed of tantalum (Ta) is oriented in a (111) plane having a maximum plane density of FCC. As previously mentioned, crystal structure of films or layers deposited on the seed layer may be influenced by the seed layer, specifically, the crystallinity of tantalum 122 at the bottom of the seed layer 120. Additionally, the seed layer may be formed of Cr, Ti and/or Ni—Cr alloy.

After forming the seed layer 120, an anti-ferromagnetic layer 130 is formed. In an anti-ferromagnetic material, the atomic magnetic moment has the same magnitude and is anti-parallel to each other. Also, the anti-ferromagnetic layer 130 fixes the magnetization direction of the ferromagnetic material. The anti-ferromagnetic layer 130 may be formed by depositing Pt—Mn alloy.

After forming the anti-ferromagnetic layer 130, a first ferromagnetic layer 140 is formed. As is well known, the parallel electron spin in the ferromagnetic material makes the magnetic moment the cause of magnetization added, so that the value of the magnetic moment can become high. The ferromagnetic layer 140 may be formed of Co, Ni or Ni alloy and/or Co alloy, for example, Co—Fe. This material has remnant magnetization even if an applied magnetic field is cut off. In another approach, the first ferromagnetic layer 144 may be formed of two ferromagnetic materials 142 and 146 stacked, with a non-ferromagnetic layer therebetween. The non-ferromagnetic layer 144 may be formed of Ru, Re, Rh, Cu and/or Cr.

Exchange coupling of the first ferromagnetic layer 140 and the anti-ferromagnetic layer 130 fixes the magnetic moment of the first ferromagnetic layer 140. Therefore, if an applied magnetic field is within some ranges, the magnetic moment of the first ferromagnetic layer 140 is not rotated.

After forming the first ferromagnetic layer 140, a FCC structured material layer 150 having the same structure of the bottom seed layer 122 comprising Ta, for example, an aluminum layer 150 is formed on the first ferromagnetic layer 140.

As previously mentioned, since the oxide layer 110, which reduces or prevents propagation of the crystallinity of the lower electrode 100, is formed on the lower electrode 100, the crystal structure of the aluminum layer may not be at least partially independent of the crystal structure of the lower electrode 100. On the other side, the aluminum layer 150 may be influenced by FCC crystal structure of tantalum 122 that comprises the seed layer 120. Accordingly, the aluminum layer 150 may be formed to be oriented in an FCC crystal structure, specifically, a (111) plane having maximum plane density preferentially.

Accordingly, the aluminum layer 150 may be crystallized in the (111) closely packed plane. As a result, the aluminum layer 150 may be formed to be very dense. In addition, if the lower electrode 100 is formed of Ti-rich TiN having a relatively large content of titanium (Ti), the surface roughness of the lower electrode 100 may be reduced. Depending on the reduced surface roughness of the lower electrode 100, the surface roughness of the aluminum layer 150 can be reduced, as well.

Figure 5:
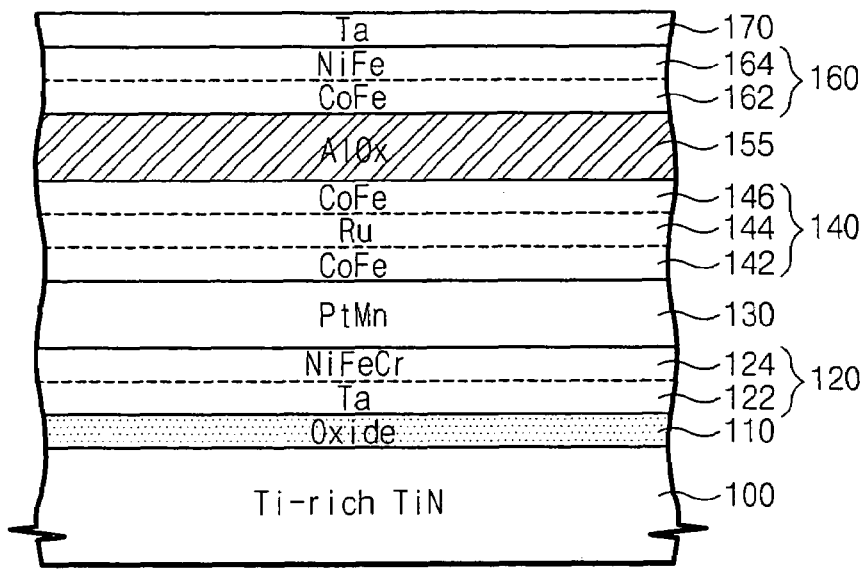

Referring to FIG. 5, the aluminum layer 150 is oxidized to form an aluminum oxide layer 155 ($AlO_x$), that is, a tunneling barrier 155. Since the aluminum layer 150 is crystallized in closely packed plane (111), the aluminum oxide layer 155 ($AlO_x$) can be formed to be very dense. Since the aluminum oxide layer 155 as the tunneling barrier is formed to be dense, a magnetic resistance ratio (MR) may be increased due to the increased tunneling effect of current. In some embodiments, the tunneling barrier 155 is formed to be thin enough for quantum-mechanical tunneling of electric charge carriers.

After forming the tunneling barrier 155, a second ferromagnetic layer 160 is formed. The second ferromagnetic layer 160 may be formed by stacking two ferromagnetic materials (e.g., Co—Fe alloy 162 and Ni—Fe alloy 164). In addition, Co, Ni—Fe—X etc., may be also used to form the second ferromagnetic layer 160. In this case, X may be Cr, Ta, Mo, Zr and/or Nb.

In the second ferromagnetic layer 160, the magnetic moment is not fixed. Accordingly, if an applied magnetic field is applied in a predetermined region, the magnetic moment of the second ferromagnetic layer 160 is rotated. A protective cap 170 may be further formed of tantalum (Ta) on the second ferromagnetic layer 160.

Figure 6:
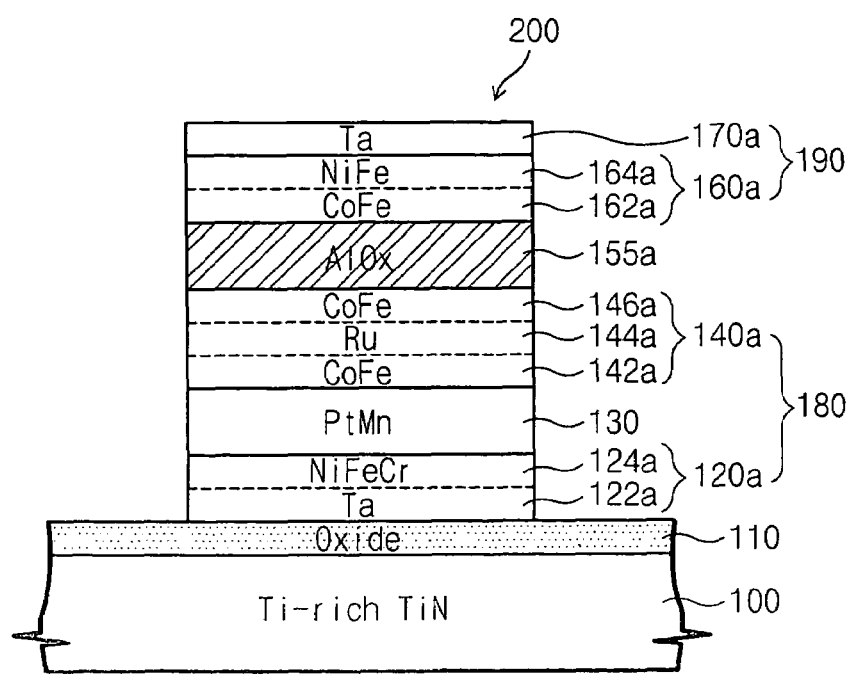

Referring to FIG. 6, the cap layer 170, the second ferromagnetic layer 160, the aluminum oxide layer 155, the first ferromagnetic layer 140, the anti-ferromagnetic layer 130 and the seed layer 120 are all patterned. Accordingly, the MTJ 200, which includes the fixed layer 180, the tunneling barrier 155a and the free layer 190, is formed. The fixed layer 180 is comprised of the seed layer 120a, the anti-ferromagnetic layer 130a and the first ferromagnetic layer 140a, which are patterned. The tunneling barrier 155a is comprised of the aluminum oxide layer ($AlO_x$) that is patterned. The free layer 190 is comprised of the cap layer 170a and the second ferromagnetic layer 160a, which are patterned.

According to the above-described process, if the oxide layer 110 is formed by ion beam etching (IBE) and providing oxygen ($O_2$) to the lower electrode 100, the tunneling barrier 155a of the MTJ may be independent of the crystallinity of the lower electrode 100. A reason for this is that the oxide layer 110 on the lower electrode 100 can reduce or prevent propagation of the crystallinity of the TiN composed of the lower electrode 100. On the other hand, since the growth of aluminum 150 that will be formed the tunneling barrier is influenced by tantalum 122 comprised of the seed layer 120, aluminum (Al) is oriented in (111) plane preferentially. The (111) plane of FCC has the most closely packed plane density.

Figures 7, 8:
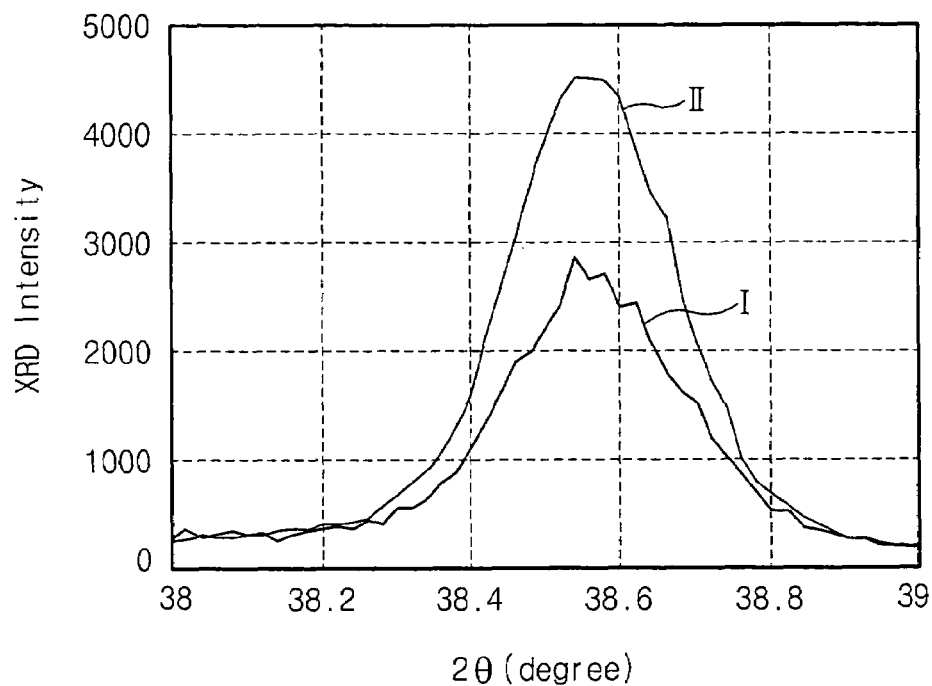
FIG. 7 is a graph showing peak intensity of a (111) aluminum plane in magnetic tunnel junction (MTJ) structures of magnetic random access memory (MRAM) devices according to embodiments of the present invention.
FIG. 8 is a table showing a magnetic resistance ratio and a resistance characteristic of magnetic tunnel junction (MTJ) structures of magnetic random access memory (MRAM) devices according to embodiments of the present invention.

Specifically, this is illustrated in (I) and (II) in FIG. 7. (I) and (II) in FIG. 7 show peak intensity (XRD intensity) of (111) plane of aluminum (Al) formed in cases where oxygen ($O_2$) is provided and is not provided after performing IBE, respectively. In other words, FIG. 7 shows that if the oxide layer is formed on the lower electrode by providing oxygen ($O_2$) in-situ after performing IBE on the lower electrode, aluminum is oriented in the (111) plane.

In addition, as shown in the table of FIG. 8, with reference to magnetic resistance (MR's)/resistances (RA's) of the Ti-rich TiN and stoichiometric Ti—N respectively, the MR of the ion beam etched and oxygen provided case can increase. This result indicates that current tunneling effect of the MTJ is increased. Additionally, in case IBE and oxygen ($O_2$) are provided, operation of the MTJ is not influenced by resistance RA.

Therefore, according to some embodiments of the invention, as illustrated in FIGS. 7 and 8, when the lower electrode is formed of TiN having a large content of titanium, and the oxide layer is formed on the lower electrode through IBE and oxygen supply, the tunneling barrier is crystallized into the most closely packed plane, thereby improving magnetic resistance ratio MR and resistance RA of the MTJ.

As previously mentioned, according to some embodiments of the invention, the lower electrode is formed of Ti-rich TiN at a relatively low chemical mechanical speed. As a result, after chemical mechanical polishing, residual TiN can be controlled properly. Also, roughness of the tunneling barrier of the magnetic tunnel junction can be reduced by reducing surface roughness of the lower electrode.

Furthermore, according to some embodiments of the present invention, since the oxide layer is interposed between the lower electrode and the magnetic tunnel junction, the crystal structure of the tunneling barrier of the magnetic tunnel junction may not be influenced by the crystal structure of the lower electrode. Also, the orientation of the tunneling barrier may be improved due to the crystallinity of the seed layer, so that the magnetic resistance ratio (MR) is increased.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A magnetic tunnel junction structure for a magnetic random access memory comprising:
    a lower electrode that comprises a Ti-rich TiN layer having a titanium (Ti) content of between about 70 and about 90 atomic percent, the Ti-rich TiN layer having a lower chemical mechanical polishing rate than a stoichiometric TiN layer and having a surface roughness that is also lower than a stoichiometric TiN layer;
    an oxide layer on the lower electrode; and
    a magnetic tunnel junction on the oxide layer, the magnetic tunnel junction comprising:
        a fixed layer including a seed layer;
        a tunneling barrier on the seed layer, that is oriented in a same crystalline direction as a most closely packed plane direction of the seed layer, the surface roughness of the tunneling barrier being reduced by the lower surface roughness of the Ti-rich TiN layer; and
        a free layer on the tunneling barrier.

2. The magnetic tunnel junction structure of claim 1, wherein the seed layer and the tunneling barrier have a same crystalline structure.

3. The magnetic tunnel junction structure of claim 2, wherein the seed layer includes tantalum (Ta), and the tunneling barrier includes oxy-aluminum ($AlO_X$).

4. The magnetic tunnel junction structure of claim 1, wherein the crystalline structure is a face centered cubic (FCC) structure.

5. The magnetic tunnel junction structure of claim 1, wherein the fixed layer includes a first ferromagnetic layer that comprises two ferromagnetic materials, and a non-ferromagnetic layer therebetween, and the non-ferromagnetic layer comprises at least one of Ru, Re, Rh, Cu and/or Cr.

6. The magnetic tunnel junction structure of claim 1, wherein the free layer is comprised of a stacked structure of two ferromagnetic materials.

7. The magnetic tunnel junction structure of claim 1, further comprising a cap layer on the free layer.

8. A magnetic tunnel junction structure of a Magnetic Random Access Memory (MRAM) device, comprising:
    a lower electrode that comprises a Ti-rich TiN layer having a titanium (Ti) content of between about 70 and about 90 atomic percent, the Ti-rich TiN layer having a lower chemical mechanical polishing rate than a stoichiometric TiN layer and having a surface roughness that is also lower than a stoichiometric TiN layer; and
    a magnetic tunnel junction on the lower electrode, the magnetic tunnel junction comprising a seed layer and a tunneling barrier that is oriented in a same direction as a most closely packed plane direction of the seed layer, the surface roughness of the tunneling barrier being reduced by the lower surface roughness of the Ti-rich TiN layer.

9. A structure of claim 8 further comprising an oxide layer between the lower electrode and the magnetic tunnel junction.

10. A magnetic tunnel junction structure of a Magnetic Random Access Memory (MRAM) device, comprising:
    a lower electrode that comprises a Ti-rich TiN layer having a titanium (Ti) content of between about 70 and about 90 atomic percent, the Ti-rich TiN layer having a lower chemical mechanical polishing rate than a stoichiometric TiN layer and having a surface roughness that is also lower than a stoichiometric TiN layer;
    an oxide layer on the lower electrode; and
    a magnetic tunnel junction on the oxide layer.

11. A magnetic tunnel junction structure of a Magnetic Random Access Memory (MRAM) device, comprising:
    a lower electrode that comprises a Ti-rich TiN layer having a titanium (Ti) content of between about 70 and about 90 atomic percent, the Ti-rich TiN layer having a lower chemical mechanical polishing rate than a stoichiometric TiN layer and having a surface roughness that is also lower than a stoichiometric TiN layer; and
    a magnetic tunnel junction on the lower electrode.

12. A structure of claim 11 wherein the magnetic tunnel junction comprises a seed layer and a tunneling barrier that is oriented in a same direction as a most closely packed plane direction of the seed layer.

13. A magnetic tunneling junction structure of a Magnetic Random Access Memory (MRAM) device, comprising:
    a lower electrode that comprises a Ti-rich TiN layer having a titanium (Ti) content of between about 70 and about 90 atomic percent, the Ti-rich TiN layer having a lower chemical mechanical polishing rate than a stoichiometric TiN layer and having a surface roughness that is also lower than a stoichiometric TiN layer; and
    a magnetic tunnel junction on the lower electrode, the magnetic tunnel junction comprising a seed layer and a tunneling barrier that is oriented in a same direction as a most closely packed plane direction of the seed layer, the surface roughness of the tunneling barrier being reduced by the lower surface roughness of the Ti-rich TiN layer.

14. A structure of claim 13, further comprising an oxide layer between the lower electrode and the magnetic tunnel junction.

* * * * *